United States Patent
Mizuno et al.

(10) Patent No.: US 11,614,493 B2
(45) Date of Patent: Mar. 28, 2023

(54) SECONDARY BATTERY SHORT-CIRCUITING ASSESSMENT DEVICE, SHORT-CIRCUITING ASSESSMENT METHOD, AND SHORT-CIRCUITING ASSESSMENT SYSTEM

(71) Applicants: Nissan Motor Co., Ltd., Yokohama (JP); Renault S.A.S., Boulogne-Billancourt (FR)

(72) Inventors: Yoshifumi Mizuno, Kanagawa (JP); Hiroyuki Wada, Kanagawa (JP); Satoshi Takaichi, Kanagawa (JP)

(73) Assignees: Nissan Motor Co., Ltd., Yokohama (JP); Renault S.A.S., Boulogne-Billancourt (FR)

( * ) Notice: Subject to any disclaimer, the term of this patent is extended or adjusted under 35 U.S.C. 154(b) by 0 days.

(21) Appl. No.: 17/634,441

(22) PCT Filed: Aug. 12, 2019

(86) PCT No.: PCT/IB2019/000751
§ 371 (c)(1),
(2) Date: Feb. 10, 2022

(87) PCT Pub. No.: WO2021/028707
PCT Pub. Date: Feb. 18, 2021

(65) Prior Publication Data
US 2022/0320611 A1 Oct. 6, 2022

(51) Int. Cl.
*G01R 31/3842* (2019.01)
*G01R 31/382* (2019.01)
*H01M 4/40* (2006.01)

(52) U.S. Cl.
CPC ....... *G01R 31/3842* (2019.01); *G01R 31/382* (2019.01); *H01M 4/405* (2013.01)

(58) Field of Classification Search
None
See application file for complete search history.

(56) References Cited

U.S. PATENT DOCUMENTS

| 2016/0061907 A1 | 3/2016 | Koba et al. |
| 2018/0053952 A1 | 2/2018 | Kotaka et al. |
| 2018/0321326 A1 | 11/2018 | Tanaka et al. |

FOREIGN PATENT DOCUMENTS

| CN | 105510843 A | 4/2016 |
| CN | 107408715 A | 11/2017 |

(Continued)

OTHER PUBLICATIONS

Wu et al. "Improving battery safety by early detection of internal shorting with a bifunctional separator" (2014) Nat Commun 5, 5193. (Year: 2014).*

(Continued)

*Primary Examiner* — Roy Y Yi
(74) *Attorney, Agent, or Firm* — Young Basile Hanlon & MacFarlane, P.C.

(57) ABSTRACT

A short-circuit prediction device for predicting the presence or absence of occurrence of an internal short circuit in a secondary battery is provided. The secondary battery has a positive electrode, a solid electrolyte, and a negative electrode that contains a lithium alloy. The short-circuit prediction device includes a measurement instrument that measures AC impedance of the secondary battery and a controller that predicts the internal short circuit in the secondary battery. The measurement instrument calculates electrolyte resistance of the secondary battery and reaction resistance of the secondary battery from the AC impedance. When a change rate of the electrolyte resistance per a predetermined period is within a predetermined range and the reaction resistance becomes higher than a predetermined (Continued)

upper limit, the controller predicts that there is a possibility of occurrence of the internal short circuit.

8 Claims, 11 Drawing Sheets

(56) References Cited

FOREIGN PATENT DOCUMENTS

| JP | 2003-317810 | A | 11/2003 |
| JP | 2012-212513 | A | 11/2012 |
| JP | 2014-206442 | A | 10/2014 |
| JP | 2016-085062 | A | 5/2016 |
| WO | 2016/208745 | A1 | 12/2016 |

OTHER PUBLICATIONS

Rosso et al. "Dendrite short-circuit and fuse effect on Li/polymer/Li cells", Electrochimica Acta, 2006, vol. 51, Issue 25, pp. 5334-5340. (Year: 2006).*

Xuning Feng, Caihao Weng, Minggao Ouyang, Jing Sun, Online internal short circuit detection for a large format lithium ion battery, Applied Energy, vol. 161, 2016, pp. 168-180, ISSN 0306-2619.

\* cited by examiner

SECONDARY BATTERY SHORT-CIRCUITING ASSESSMENT DEVICE, SHORT-CIRCUITING ASSESSMENT METHOD, AND SHORT-CIRCUITING ASSESSMENT SYSTEM

TECHNICAL FIELD

The present invention relates to a short-circuit prediction device, a short-circuit prediction method, and a short-circuit prediction system for a secondary battery.

BACKGROUND

A state detection method for detecting the state of a lithium secondary battery has heretofore been known (JP2012-212513A). The state detection method described in JP2012-212513A includes discharging the battery to an SOC of 10% or less, measuring the impedance of the discharged battery, and calculating a reaction resistance value from an impedance circle obtained by plotting the real part and imaginary part of the impedance in plane coordinates. Then, when the calculated reaction resistance value exceeds a predetermined threshold, a determination is made that deterioration occurs in the battery.

SUMMARY

In an all-solid-state lithium secondary battery using a solid electrolyte, metal lithium may precipitate to form dendrites at the interface between the negative electrode and the solid electrolyte. Then, such dendrites cause an internal short circuit of the secondary battery.

However, even if the state of the all-solid-state lithium secondary battery is detected by the above-described conventional method, there is a problem that the internal short circuit due to the dendrites cannot be predicted before the short circuit occurs.

A problem to be solved by the present invention is to provide a short-circuit prediction device, a short-circuit prediction method, and a short-circuit prediction system for a secondary battery that are able to predict an internal short circuit due to lithium dendrites before the short circuit occurs.

The present invention solves the above problem through calculating electrolyte resistance of a secondary battery and reaction resistance of the secondary battery from AC impedance and, when a change rate of the electrolyte resistance in a predetermined period is within a predetermined range and the reaction resistance becomes higher than a predetermined upper limit, predicting that there is a possibility of occurrence of an internal short circuit.

According to the present invention, an internal short circuit due to lithium dendrites can be predicted before the short circuit occurs.

DETAILED DESCRIPTION

Figure 1:
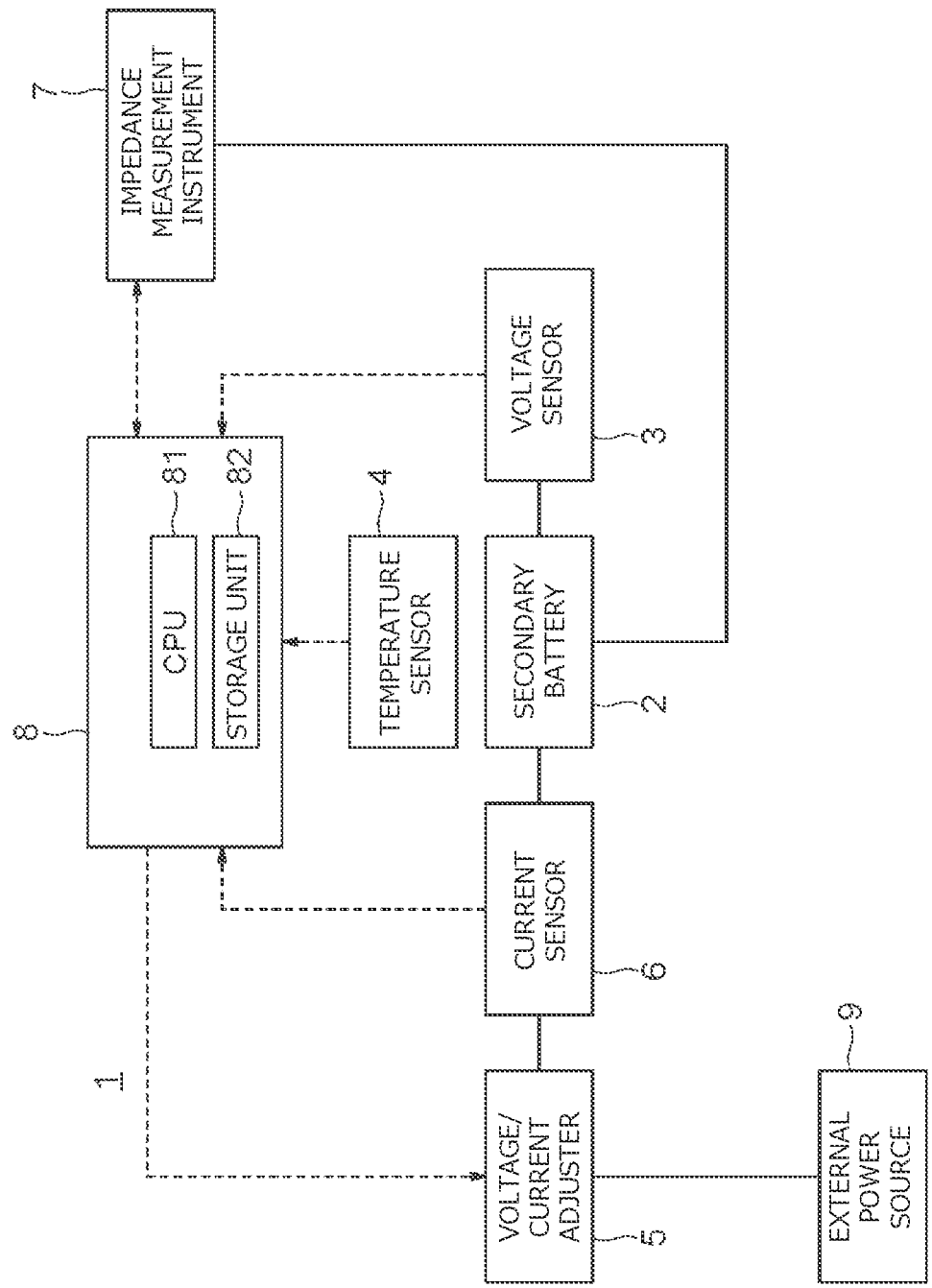
FIG. 1 is a block diagram illustrating a charge control system for a secondary battery according to an embodiment of the present invention.

FIG. 1 is a diagram illustrating the configuration of a short-circuit prediction system for a secondary battery according to an embodiment of the present invention. The short-circuit prediction system for a secondary battery according to the present embodiment determines whether or not there is a possibility of occurrence of an internal short circuit in an all-solid-state lithium-ion secondary battery. As illustrated in FIG. 1, the short-circuit prediction system 1 includes a secondary battery 2, a voltage sensor 3, a temperature sensor 4, a voltage/current adjuster 5, a current sensor 6, an impedance measurement instrument 7, a controller 8, and an external power source 9. The short-circuit prediction system illustrated in FIG. 1 is a system for charging the secondary battery 2 with the electric power of the external power source 9 and, during the charging, determines the presence or absence of a possibility of the occurrence of an internal short circuit in the secondary battery 2.

The secondary battery 2, which is an all-solid lithium-ion secondary battery, includes a power generation element having one or more positive electrodes, one or more negative electrodes, and one or more solid electrolyte layers. Each positive electrode includes one or more positive electrode active material layers that contain a positive electrode active material capable of storing and releasing lithium ions. Each negative electrode includes one or more negative electrode active material layers that contain a negative electrode active material capable of storing and releasing lithium ions. Each solid electrolyte layer is interposed between a positive electrode active material layer and a negative electrode active material layer. The secondary battery 2 has, in addition to the power generation element, electrode tabs and an exterior member that houses the electrode tabs and the power generation element. The detailed structure and material of the secondary battery will be described later.

The voltage sensor 3 is a sensor for detecting the input/output voltage of the secondary battery 2 and detects the cell voltage (inter-terminal voltage) between the positive electrodes and the negative electrodes of the secondary battery 2. The connection position of the voltage sensor 3 is not particularly limited and may be a position at which the cell voltage between the positive electrodes and the negative electrodes can be detected in the circuit connected to the secondary battery 2.

The temperature sensor 4 measures the outer surface temperature (environmental temperature) of the secondary battery 2. The temperature sensor 4 is attached, for example, to the surface of the case (exterior body, housing) or the like of the secondary battery 2.

The voltage/current adjuster 5 is a circuit for adjusting the battery current and the battery voltage during the charging and/or discharging of the secondary battery 2 and adjusts the current/voltage of the secondary battery 2 based on a command from the controller 8. The voltage/current adjuster 5 has a voltage conversion circuit or the like for converting the power output from the external power source into the charging voltage of the secondary battery.

The current sensor 6 is a sensor for detecting the input/output current of the secondary battery 2. The current sensor 6 detects the current supplied from the voltage/current adjuster 5 to the secondary battery 2 during the charging of the secondary battery 2 and detects the current supplied from the secondary battery 2 to the voltage/current adjuster 5 during the discharging of the secondary battery 2.

The impedance measurement instrument 7 is connected to the secondary battery 2 and measures AC impedance (complex impedance) of the secondary battery 2 by flowing an AC perturbation current through the secondary battery 2 as an input signal to acquire a response voltage corresponding to the AC current. The impedance measurement instrument 7 may be arbitrarily selected from those usually used as a general AC impedance measurement device. For example, the impedance measurement instrument 7 may be one that measures the AC impedance of the secondary battery 2 using an AC impedance method while varying the frequency of the AC perturbation current with time. The impedance measurement instrument 7 may also be one that can apply a plurality of AC perturbation currents having different frequencies at the same time. The method of measuring the AC impedance in the AC impedance method is not particularly limited. For example, analog schemes such as a Lissajous method and an AC bridge method and digital schemes such as a digital Fourier integral method and a fast Fourier transformation method with addition of noise can be appropriately adopted. In the present embodiment, two or more AC perturbation currents having different frequencies are applied to the secondary battery 2 to measure the AC impedance. The two or more frequencies may fall within a range that allows the electrolyte resistance component and reaction resistance component of the secondary battery 2 to be calculated from a graph (Nyquist plot; Cole-Cole plot) in which a real part component $Z'$ and an imaginary part component $Z''$ that constitute AC impedance $Z$ measured by the impedance measurement instrument 7 are plotted on complex plane coordinates. As an example, the two or more frequencies are typically about 1 MHz to 0.1 Hz and can be preferably about 1 kHz to 0.1 Hz. This allows the electrolyte resistance component and reaction resistance component of the secondary battery 2 to be calculated with a high degree of accuracy from the measurement result of the AC impedance. The amplitude or the like of the waveform (e.g., a sinusoidal wave) of the AC perturbation current applied to the battery is not particularly limited and is set arbitrarily. The measurement result of the AC impedance measured by the impedance measurement instrument 7 is sent to the controller 8 as the output of the impedance measurement instrument 7.

The controller 8 has a CPU 81, a storage unit 82, and other associated components. The controller 8 is a control device for predicting the possibility of an internal short circuit in the secondary battery 2 based on the AC impedance of the secondary battery 2 measured by the impedance measurement instrument 7. In addition, the controller 8 controls the charging of the secondary battery 2 based on the terminal voltage of the secondary battery 2 detected by the voltage sensor 3 and the charging/discharging current flowing through the secondary battery 2 detected by the current sensor 6.

The external power source 9 is a power source for charging the secondary battery 2. As the power source, for example, an AC power source of three-phase 200 V is used. Alternatively, the external power source 9 may be an AC power source of single-phase 100V or single-phase 200V. The external power source 9 is not limited to being an AC power source and may also be a DC power source.

Figure 2:
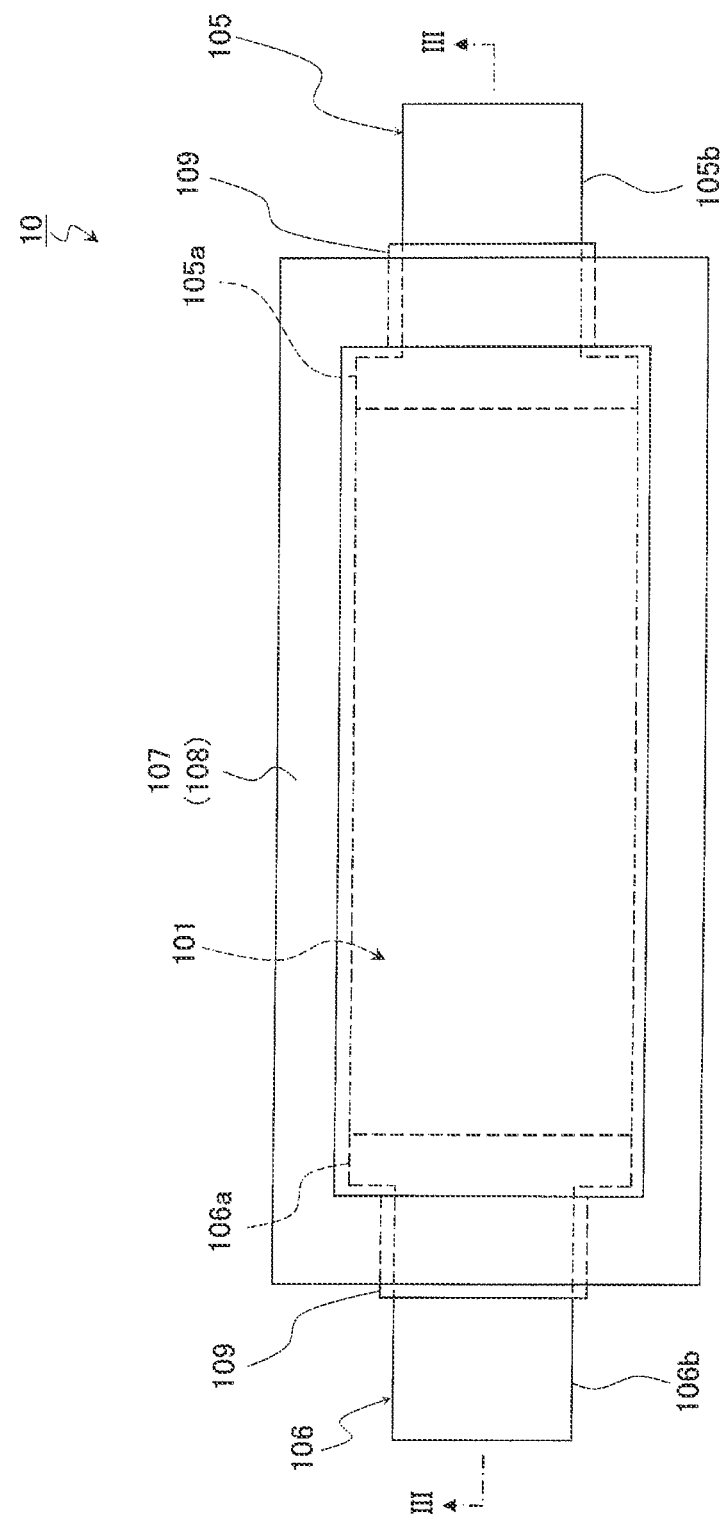
FIG. 2 is a plan view of a secondary battery according to the present embodiment.

The structure of the secondary battery 2 will then be described with reference to FIGS. 2 and 3. FIG. 2 illustrates a plan view of the secondary battery 2 according to the present embodiment and FIG. 3 illustrates a cross-sectional view of the secondary battery 2 along line III-III of FIG. 2.

Figure 3:
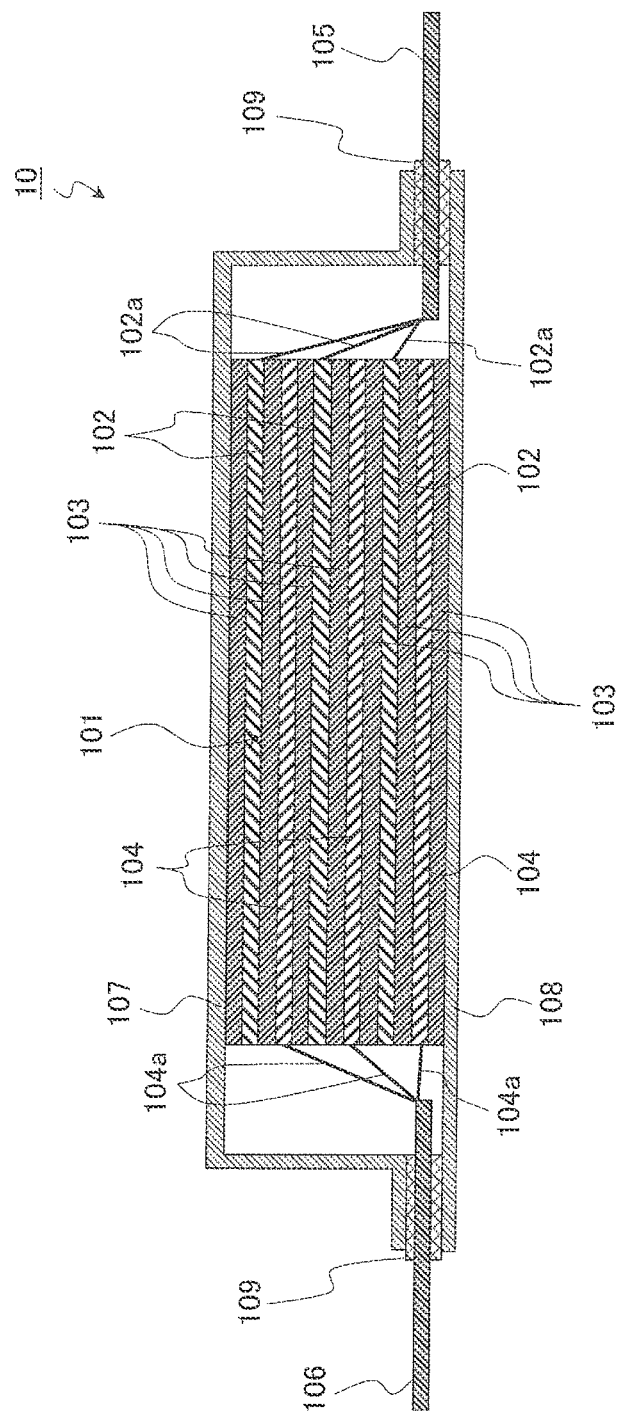
FIG. 3 is a cross-sectional view of the secondary battery along line III-III of FIG. 2.

As illustrated in FIGS. 2 and 3, the secondary battery 2 is composed of a power generation element 101 having three positive electrode layers 102, seven electrolyte layers 103, and three negative electrode layers 104, a positive electrode tab 105 connected to the three positive electrode layers 102, a negative electrode tab 106 connected to the three negative electrode layers 104, and an upper exterior member 107 and a lower exterior member 108 that house and seal the power generation element 101, the positive electrode tab 105, and the negative electrode tab 106.

The numbers of the positive electrode layers 102, electrolyte layers 103, and negative electrode layers 104 are not particularly limited. The power generation element 101 may be composed of one positive electrode layer 102, three electrolyte layers 103, and one negative electrode layer 104. If necessary, the numbers of the positive electrode layer(s) 102, electrolyte layers 103, and negative electrode layer(s) 104 may be selected appropriately.

Each of the positive electrode layers 102 constituting the power generation element 101 has a positive electrode side current collector 102a extending to the positive electrode tab 105 and positive electrode active material layers formed on both main surfaces of a part of the positive electrode side current collector 102a. The positive electrode side current collector 102a constituting each positive electrode layer 102 can be composed, for example, of metal foil that is electrochemically stable, such as aluminum foil, aluminum alloy foil, copper titanium foil, or stainless steel foil. Nickel, iron, copper, or the like may also be used as a metal for the positive electrode side current collector 102a. Other than these, a clad material of nickel and aluminum, a clad material of copper and aluminum, or the like may also be used.

For the positive electrode side current collector 102a, a resin having electric conductivity may also be used as substitute for metal. Such a resin having electric conductivity can be composed of a resin in which a conductive filler is added to a non-conductive polymer material as necessary. As the non-conductive polymer material, for example, a material having excellent potential resistance is used, such as polyethylene (PE; high-density polyethylene (HDPE), low-density polyethylene (LDPE), or the like), polypropylene (PP), or polyethylene terephthalate (PET). The conductive filler can be used without particular limitation, provided that it is a material having electric conductivity. For example, materials that are excellent in the electric conductivity, potential resistance, or lithium ion blocking property include metals and conductive carbon. Such metals are not particularly limited and include at least one metal selected from the group consisting of Ni, Ti, Al, Cu, Pt, Fe, Cr, Sn, Zn, In, and Sb or alloys or metal oxides that contain such metals.

The positive electrode active material layers constituting the positive electrode layers 102 are not particularly limited, and examples of their materials include bedded salt-type active materials such as $LiCoO_2$, $LiMnO_2$, $LiNiO_2$, $LiVO_2$, and $Li(Ni-Mn-Co)O_2$, spinel-type active materials such as $LiMn_2O_4$ and $LiNi_{0.5}Mn_{1.5}O_4$, olivine-type active materials such as $LiFePO_4$ and $LiMnPO_4$, and Si-containing active materials such as $Li_2FeSiO_4$ and $Li_2MnSiO_4$. Examples of oxide active materials other than the above include $Li_4Ti_5O_{12}$. A composite oxide containing lithium and nickel is preferably used, and more preferably, $Li(Ni-Mn-Co)O_2$ and those in which one or more of these transition metals are substituted with other elements (also simply referred to as "NMC composite oxides") are used. As described above, the NMC composite oxides include those in which one or more of transition metal elements are substituted with other metal elements. Examples of other elements in that case include Ti, Zr, Nb, W, and P.

A sulfur-based positive electrode active material may be used for the positive electrode active material layers. Examples of the sulfur-based positive electrode active material include particles or thin films of an organic sulfur compound or an inorganic sulfur compound, which may be materials that can release lithium ions during the charging and store lithium ions during the discharging by using the redox reaction of sulfur. Examples of the organic sulfur compound include a disulfide compound and a sulfur-modified polyacrylonitrile. Examples of the inorganic sulfur compound include sulfur (S), S-carbon composite, $TiS_2$, $TiS_3$, $TiS_4$, NiS, $NiS_2$, CuS, $FeS_2$, $Li_2S$, $MoS_2$, and $MoS_3$.

A positive electrode active material other than the above may also be used. Examples of the shape of the positive electrode active material include a particle-like shape (spherical shape, fibrous shape) and a thin film-like shape. The content of the positive electrode active material in the positive electrode active material layers is not particularly limited. The positive electrode active material layer may further contain at least one of a solid electrolyte, a conductive aid, and a binder, as necessary. Examples of the shape of the positive electrode active material include a particle-like shape (spherical shape, fibrous shape) and a thin film-like shape. The content of the positive electrode active material in the positive electrode active material layers is not particularly limited. The positive electrode active material layer may further contain at least one of a solid electrolyte, a conductive aid, and a binder, as necessary. Examples of the solid electrolyte include a sulfide solid electrolyte and an oxide solid electrolyte, and those exemplified as solid electrolytes capable of forming the electrolyte layers 103, which will be described later, can be used.

The conductive aid is not particularly limited, but its shape is preferably a particle-like shape or a fibrous shape. When the conductive aid is in a particle-like shape, the shape of particles is not particularly limited and may be any shape such as a powder-like shape, a spherical shape, a rod-like shape, a needle-like shape, a plate-like shape, a columnar shape, an indefinite shape, a flake-like shape, or a spindle-like shape.

The average particle diameter (primary particle diameter) when the conductive aid is in a particle-like shape is not particularly limited, but is preferably 0.01 to 10 μm from the viewpoint of the electrical characteristics of the battery.

Examples of the binder include thermoplastic polymers such as polybutylene terephthalate, polyethylene terephthalate, polyvinylidene fluoride (PVDF) (which encompasses compounds in which hydrogen atoms are substituted with halogen elements), polyethylene, polypropylene, polymethylpentene, polybutene, polyethernitrile, polytetrafluoroethylene, polyacrylonitrile, polyimide, polyamide, ethylene-vinyl acetate copolymer, polyvinyl chloride, styrene/butadiene rubber (SBR), ethylene/propylene/diene copolymer, styrene/butadiene/styrene block copolymer and its hydrogenated products, and styrene/isoprene/styrene block copolymer and its hydrogenated products; fluorine resins such as tetrafluoroethylene/hexafluoropropylene copolymer (FEP), tetrafluoroethylene/perfluoroalkyl vinyl ether copolymer (PFA), ethylene/tetrafluoroethylene copolymer (ETFE), polychlorotrifluoroethylene (PCTFE), ethylene/chlorotrifluoroethylene copolymer (ECTFE), and polyvinyl fluoride (PVF); vinylidenefluoride-based fluoro-rubbers such as vinylidenefluoride-hexafluoropropylene-based fluoro-rubber (VDF-HFP-based fluoro-rubber), vinylidenefluoride-hexafluoropropylene-tetrafluoroethylene-based fluoro-rubber (VDF-HFP-TFE-based fluoro-rubber), vinylidenefluoride-pentafluoropropylene-based fluoro-rubber (VDF-PFP-based fluoro-rubber), vinylidenefluoride-pentafluoropropylene-tetrafluoroethylene-based fluoro-rubber (VDF-PFP-TFE-based fluoro-rubber), vinylidenefluoride-perfluoromethylvinylether-tetrafluoroethylene-based fluoro-rubber (VDF-PFMVE-TFE-based fluoro-rubber), and vinylidenefluoride-chlorotrifluoroethylene-based fluoro-rubber (VDF-CTFE-based fluoro-rubber); and epoxy resins. Among these, polyimide, styrene/butadiene rubber, carboxymethyl cellulose, polypropylene, polytetrafluoroethylene, polyacrylonitrile, and polyamide are more preferred.

Respective positive electrode side current collectors 102a that constitute the three positive electrode layers 102 are joined to the positive electrode tab 105. Aluminum foil, aluminum alloy foil, copper foil, nickel foil, or the like can be used as the positive electrode tab 105.

Each of the negative electrode layers 104 constituting the power generation element 101 has a negative electrode side current collector 104a extending to the negative electrode tab 106 and negative electrode active material layers formed on both main surfaces of a part of the negative electrode side current collector 104a.

The negative electrode side current collector 104a of each negative electrode layer 104 is, for example, metal foil that is electrochemically stable, such as nickel foil, copper foil, stainless steel foil, or iron foil.

The negative electrode active material layers constituting the negative electrode layers 104 are formed of layers that contain a lithium alloy. Examples of the lithium alloy include alloys of lithium and at least one type of metal selected, for example, from gold (Au), magnesium (Mg), aluminum (Al), calcium (Ca), zinc (Zn), tin (Sn), and bismuth (Bi). The lithium alloy may also be an alloy of lithium and two or more types of metals among the above-described metals. Specific examples of the lithium alloy include, for example, lithium-gold alloy (Li—Au), lithium-magnesium alloy (Li—Mg), lithium-aluminum alloy (Li—Al), lithium-calcium alloy (Li—Ca), lithium-zinc alloy (Li—Zn), lithium-tin alloy (Li—Sn), and a lithium-bismuth alloy (Li—Bi).

The configuration of each negative electrode active material layer is not particularly limited, provided that it contains a lithium alloy. For example, when one or more metals other than lithium that constitute the lithium alloy are represented by "Me," any of the following forms (1) to (3) can be adopted:

(1) A form composed of a single layer consisting only of a lithium alloy (i.e., a Li-Me layer);

(2) A form including a layer composed of lithium metal and a layer composed of a lithium alloy (i.e., a Li layer/Li-Me layer); and (3) A form including a layer composed of lithium metal, a layer composed of a lithium alloy, and a layer composed of a metal other than lithium (i.e., Li layer/Li-Me layer/Me layer).

In the above form (2), it is preferred to provide the layer composed of a lithium alloy (Li-Me layer) as a layer on the electrolyte layer 103 side (a layer that forms the interface with each electrolyte layer 103). In the above form (3), it is preferred to provide the layer composed of a metal other than lithium (Me layer) as a layer on the electrolyte layer 103 side (a layer that forms the interface with each electrolyte layer 103). When a lithium metal layer that contains lithium metal and a layer that contains a metal different from lithium metal (intermediate layer) are adopted, the intermediate layer is a layer between the lithium metal layer and the solid electrolyte, and it is preferred to alloy at least a part of the lithium metal with at least a part of the metal which forms the intermediate layer.

For example, when the negative electrode is in the above form (3), that is, in the form including a layer composed of lithium metal, a layer composed of a lithium alloy, and a layer composed of a metal other than lithium (i.e., Li layer/Li-Me layer/Me layer), the lithium metal and the metal other than lithium can be laminated to alloy an interface portion between them, thereby forming a layer composed of a lithium alloy at the interface. The method of laminating the lithium metal and the metal other than lithium is not particularly limited, but examples of the method include a method of depositing the metal other than lithium on the layer composed of the lithium metal by vacuum vapor deposition or the like to form the layer composed of the metal other than lithium on the layer composed of the lithium metal while alloying the interface portion between them. Another method may include depositing lithium metal on the layer composed of the metal other than lithium by vacuum vapor deposition or the like to form the layer composed of the lithium metal on the layer composed of the metal other than lithium while alloying the interface portion between them.

In the secondary battery 2 of the present embodiment, the three negative electrode layers 104 are configured such that respective negative electrode side current collectors 104a constituting the negative electrode layers 104 are joined to a single negative electrode tab 106. That is, in the secondary battery 2 of the present embodiment, the negative electrode layers 104 are configured to be joined to a single common negative electrode tab 106.

The electrolyte layers 103 of the power generation element 101 prevent a short circuit between the positive electrode layers 102 and the negative electrode layers 104 described above. Each of the electrolyte layers 103 is a layer that contains a solid electrolyte as the main component and is interposed between a corresponding positive electrode active material layer and a corresponding negative electrode active material layer described above. Examples of the solid electrolyte include, for example, a sulfide solid electrolyte, an oxide solid electrolyte, and a polymer solid electrolyte, among which the sulfide solid electrolyte is preferred.

Examples of the sulfide solid electrolyte include LiI—$Li_2S$—$SiS_2$, LiI—$Li_2S$—$P_2O_5$, LiI—$Li_3PO_4$—$P_2S_5$, $Li_2S$—$P_2S_5$, LiI—$Li_3PS_4$, LiI—LiBr—$Li_3PS_4$, $Li_3PS_4$, $Li_2S$—$P_2S_5$, $Li_2S$—$P_2S_5$—LiI, $Li_2S$—$P_2S_5$—$Li_2O$, $Li_2S$—$P_2S_5$—$Li_2O$LiI, $Li_2S$—$SiS_2$, $Li_2S$—$SiS_2$—LiI, $Li_2S$—$SiS_2$—LiBr, $Li_2S$—$SiS_2$—LiCl, $Li_2S$—$SiS_2$—$B_2S_3$—LiI, $Li_2S$—$SiS_2$—$P_2S_5$—LiI, $Li_2S$—$B_2S_3$, $Li_2S$—$P_2S_5$-ZmSn (where m and n are positive numbers and Z is any of Ge, Zn, and Ga), $Li_2S$—$GeS_2$, $Li_2S$—$SiS_2$—$Li_3PO_4$, and $Li_2S$—$SiS_2$—$Li_xMO_y$ (where x and y are positive numbers and M is any of P, Si, Ge, B, Al, Ga, and In). The description of "$Li_2S$—$P_2S_5$" means a sulfide solid electrolyte obtained using a raw material composition that contains $Li_2S$ and $P_2S_5$, and the same applies to other descriptions.

The sulfide solid electrolyte may have, for example, a $Li_3PS_4$ skeleton, a $Li_4P_2S_7$ skeleton, or a $Li_4P_2S_6$ skeleton. Examples of the sulfide solid electrolyte having a $Li_3PS_4$ skeleton include, for example, LiI—$Li_3PS_4$, LiI—LiBr—$Li_3PS_4$, and $Li_3PS_4$. Examples of the sulfide solid electrolyte having a $Li_4P_2S_7$ skeleton include, for example, a Li—P—S-based solid electrolyte referred to as LPS (e.g., $Li_7P_3S_{11}$). As the sulfide solid electrolyte, for example, LGPS represented by $Li_{(4-x)}Ge_{(1-x)}P_xS_4$ (x satisfies 0<x<1) may also be used. Among these, a sulfide solid electrolyte that contains a P element is preferred, and a material that contains $Li_2S$—$P_2S_5$ as the main component is more preferred. The sulfide solid electrolyte may contain halogen (F, Cl, Br, I).

When the sulfide solid electrolyte is a $Li_2S$—$P_2S_5$-based one, the ratio of $Li_2S$ and $P_2S_5$ is preferably in a range of $Li_2S$:$P_2S_5$=50:50 to 100:0 and particularly preferably in a range of $Li_2S$:$P_2S_5$=70:30 to 80:20 in terms of the molar ratio. The sulfide solid electrolyte may be sulfide glass, crystallized sulfide glass, or a crystalline material obtained by a solid phase method. The sulfide glass can be obtained, for example, by performing mechanical milling (such as using a ball mill) on the raw material composition. The crystallized sulfide glass can be obtained, for example, by performing heat treatment on the sulfide glass at a temperature equal to or higher than the crystallization temperature. The ion conductivity (e.g., Li ion conductivity) of the sulfide solid electrolyte at room temperature (25° C.) is preferably $1 \times 10^{-5}$ S/cm or more and more preferably $1 \times 10^{-4}$ S/cm or more. The value of ion conductivity of the solid electrolyte can be measured by the AC impedance method.

Examples of the oxide solid electrolyte include, for example, a compound having a NASICON-type structure. Examples of the compound having a NASICON-type structure include a compound represented by a general formula of $Li_{1+x}Al_xGe_{2-x}(PO_4)_3$ (0<x<2) (LAGP) and a compound represented by a general formula of $Li_{1+x}Al_xTi_{2-x}(PO_4)_3$ (0<x<2) (LATP). Other examples of the oxide solid electrolyte include LiLaTiO (e.g., $Li_{0.34}La_{0.51}TiO_3$), LiPON (e.g., $Li_{2.9}PO_{3.3}N_{0.46}$), and LiLaZrO (e.g., $Li_7La_3Zr_2O_{12}$).

The solid electrolyte layers 103 may further contain a binder in addition to the above-described solid electrolyte.

The binder is not particularly limited, but for example, the above-described binders can be used.

The content of the solid electrolyte is, for example, preferably within a range of 10 to 100 mass %, more preferably within a range of 50 to 100 mass %, and further preferably within a range of 90 to 100 mass %.

As illustrated in FIG. 3, the positive electrode layers 102 and the negative electrode layers 104 are alternately laminated via five electrolyte layers 103 and two electrolyte layers 103 are further laminated on the uppermost layer and the lowermost layer to form the power generation element 101.

The power generation element 101 configured as described above is housed and sealed in the upper exterior member 107 and lower exterior member 108 (sealing means). The upper exterior member 107 and the lower exterior member 108 for sealing the power generation element 101 are formed, for example, of a material having flexibility, such as a resin film of polyethylene, polypropylene, or the like or a resin-metal thin film laminated material obtained by laminating a resin of polyethylene, polypropylene, or the like on both surfaces of metal foil such as aluminum foil. The upper exterior member 107 and the lower exterior member 108 are subjected to thermal fusion bonding thereby to seal the power generation element 101 in a state in which the positive electrode tab 105 and the negative electrode tab 106 are led out to the outside.

To ensure adhesion to the upper exterior member 107 and the lower exterior member 108, portions of the positive electrode tab 105 and negative electrode tab 106 to be in contact with the upper exterior member 107 and the lower exterior member 108 are provided with respective seal films 109. The seal films 109 are not particularly limited, but can be composed, for example, of a synthetic resin material excellent in the electrolyte resistance and thermal fusion bonding properties, such as polyethylene, modified polyethylene, polypropylene, modified polypropylene, or ionomer.

The description will then be directed to an internal short-circuit prediction method for the secondary battery 2 and a charge control method for the secondary battery 2 in the present embodiment. In the present embodiment, the internal short-circuit prediction control for the secondary battery 2, which will be described below, is executed by the impedance measurement instrument 7 and the controller 8. The internal short-circuit prediction control is executed during the charge control for the secondary battery 2. The charge control for the secondary battery 2 is executed by the voltage/current adjuster 5 and the controller 8.

First, the charge control for the secondary battery 2 will be described. In the present embodiment, the controller 8 gradually increases the current until the charging voltage of the secondary voltage 2 reaches a predetermined upper limit voltage, and when the charging current of the secondary battery 2 reaches a set current, the controller 8 makes the current value constant (so-called constant current control; CC charging). During the charging of the secondary battery 2, the controller 8 acquires the detection values from the voltage sensor 3 and the current sensor 6 and manages the current flowing through the secondary battery 2 and the voltage applied to the secondary battery 2. The controller 8 also manages the SOC of the secondary battery 2 based on the detected voltage of the voltage sensor 3. In the present embodiment, by performing the charging of the secondary battery 2 with the set current, the SOC of the secondary battery 2 increases and the voltage of the secondary battery 2 gradually increases.

When the voltage of the secondary battery 2 reaches the upper limit voltage, the controller 8 performs constant voltage charging (CV charging) at the upper limit voltage. While the voltage of the secondary battery 2 is maintained at the upper limit voltage, the charging current decreases as the SOC of the secondary battery 2 increases. In the present embodiment, when the charging current decreases and drops to a cutoff current value, the charging of the secondary battery 20 is concluded. In the present embodiment, the charge control of the secondary battery 20 is thus performed. The charging method is not limited to the so-called CC-CV charging as described above, and other charging methods may also be used.

Figure 4:
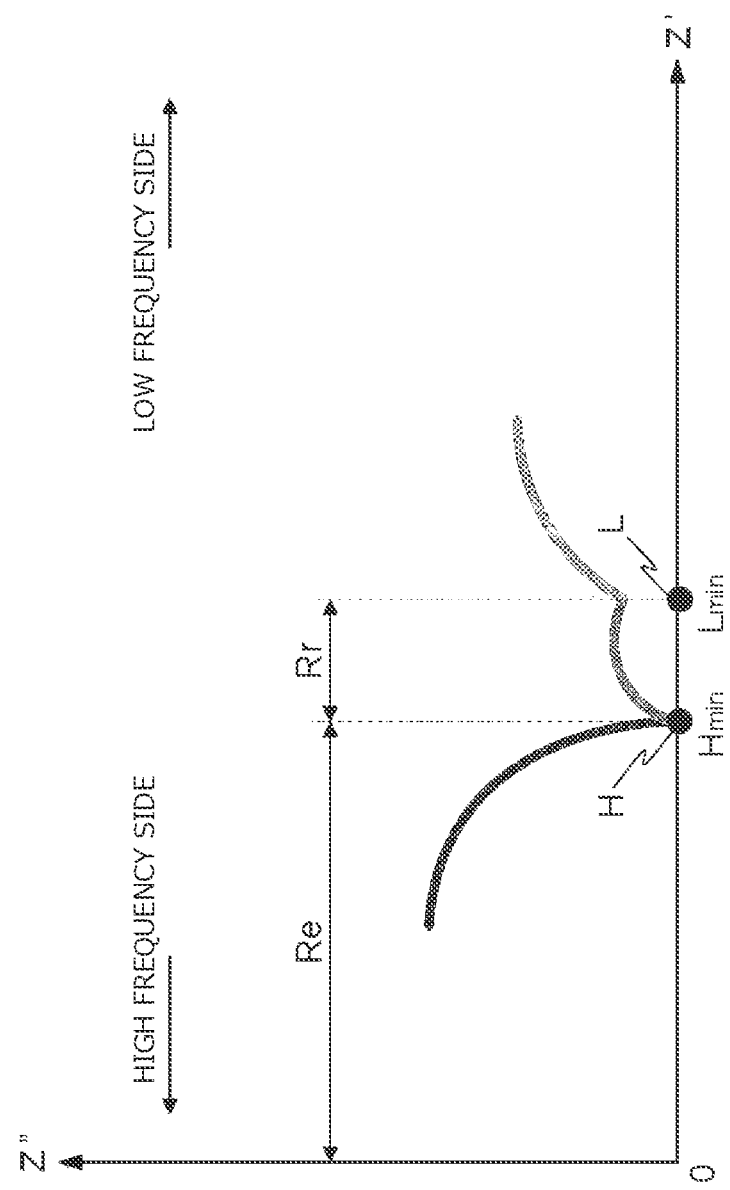
FIG. 4 is a graph of a complex impedance plot (Nyquist plot; Cole-Cole plot) including an arc trajectory, which is obtained by plotting the real axis component value (Z') and imaginary axis component value (Z") of AC impedance measured by an impedance measurement instrument on complex plane coordinates in which the real axis and the imaginary axis are orthogonal to each other.

The internal short-circuit prediction control for the secondary battery 2 will then be described. In the present embodiment, to predict an internal short circuit of the secondary battery 2, the electrolyte resistance and reaction resistance of the secondary battery 2 are first calculated. FIG. 4 is a graph of a complex impedance plot (Nyquist plot; Cole-Cole plot) including an arc trajectory, which is obtained by plotting the real axis component value (Z') and imaginary axis component value (Z") of AC impedance measured by the impedance measurement instrument 7 on complex plane coordinates in which the real axis and the imaginary axis are orthogonal to each other.

The impedance measurement instrument 7 applies AC signals having a large number of frequency values within a predetermined frequency band to measure the real axis component value (Z') and imaginary axis component value (Z") of the AC impedance for each of the frequency values. The predetermined frequency band includes frequencies for measuring the electrolyte resistance and frequencies for measuring the reaction resistance. The frequencies for measuring the electrolyte resistance are set between 1 kHz and 10 MHz, and the frequencies for measuring the reaction resistance are set between 1 Hz and 1 kHz. Then, on the complex plane coordinates in which the real axis and the imaginary axis are orthogonal to each other, the real axis component value is plotted as the real axis component of the complex plane coordinates and the imaginary axis component value is plotted as the imaginary axis component of the complex plane coordinates. This allows the complex impedance plot (Nyquist plot; Cole-Cole plot) to be obtained, which includes an arc trajectory within a frequency range of 1 kHz to 1 Hz as illustrated in FIG. 4. Then, the electrolyte resistance (Re) can be obtained through specifying a local minimum value $H_{min}$ of the above arc trajectory on the high frequency side and a local minimum value $L_{min}$ of the above arc trajectory on the low frequency side and determining the distance from the origin of the complex plane coordinates to a point H indicating the local minimum value $H_{min}$ on the high frequency side. In addition, the reaction resistance (Rr) can be obtained by determining the distance between the point H indicating the local minimum value $H_{min}$ on the high frequency side and a point L indicating the local minimum value $L_{min}$ on the low frequency side.

The impedance measurement instrument 7 applies the AC signals at a predetermined cycle to the secondary battery 2 based on a control command from the controller 8 to receive a response signal from the secondary battery 2 and measures the AC impedance. In addition, the impedance measurement instrument 7 calculates, from the measured AC impedance, the electrolyte resistance and the reaction resistance at a predetermined cycle by the above calculation method based on the complex impedance plot.

The controller 8 calculates the change rate of the electrolyte resistance per a predetermined period based on the electrolyte resistance measured by the impedance measurement instrument 7 and determines whether or not the change rate of the electrolyte resistance per the predetermined period is within a predetermined range. The predetermined period is set to a certain length in order to determine that the electrolyte resistance does not substantially change, and is set to a period of time at least longer than the detection cycle of the voltage sensor 3 or the like and/or the calculation cycle of the impedance measurement instrument. That is, in the present embodiment, the measurement data of the electrolyte resistance is collected using the impedance measurement instrument 7 in order to determine the presence or absence of occurrence of an internal short circuit in the secondary battery 2, but the time for data collection is short, so the cycle (corresponding to the "predetermined period") for the determination based on the electrolyte resistance is set long. The change rate of the electrolyte resistance is, for example, the rate of increase of the electrolyte resistance with respect to the previous value, and when expressed as a percentage, the predetermined range may be set, for example, to ±7%, preferably ±5%, and more preferably ±3%.

In addition, the controller 8 compares the reaction resistance calculated by the impedance measurement instrument 7 with a predetermined upper limit that is preliminarily set, and determines whether or not the reaction resistance is higher than the predetermined upper limit. The predetermined upper limit is a determination threshold for determining the presence or absence of the possibility of an internal short circuit due to dendrites. The predetermined upper limit is a value that is experimentally determined depending on the material used for the secondary battery 2 and the like, and is preliminarily set. For example, the current density is gradually increased for a secondary battery 2 for reference to obtain the reaction resistance when an internal short circuit occurs. Then, a reaction resistance value lower than the obtained reaction resistance value may be set as the predetermined upper limit.

The controller 8 determines whether or not the change rate of the electrolyte resistance per the predetermined period is within the predetermined range and the reaction resistance is higher than the predetermined upper limit. Then, when the change rate of the electrolyte resistance per the predetermined period is within the predetermined range and the reaction resistance is higher than the predetermined upper limit, the controller 8 predicts that there is a possibility of an internal short circuit in the secondary battery 2. On the other hand, when the change rate of the electrolyte resistance per the predetermined period is out of the predetermined range, or when the reaction resistance per the predetermined period is not higher than the predetermined upper limit, the controller 8 predicts that there is no possibility of an internal short circuit in the secondary battery 2.

Figure 5:
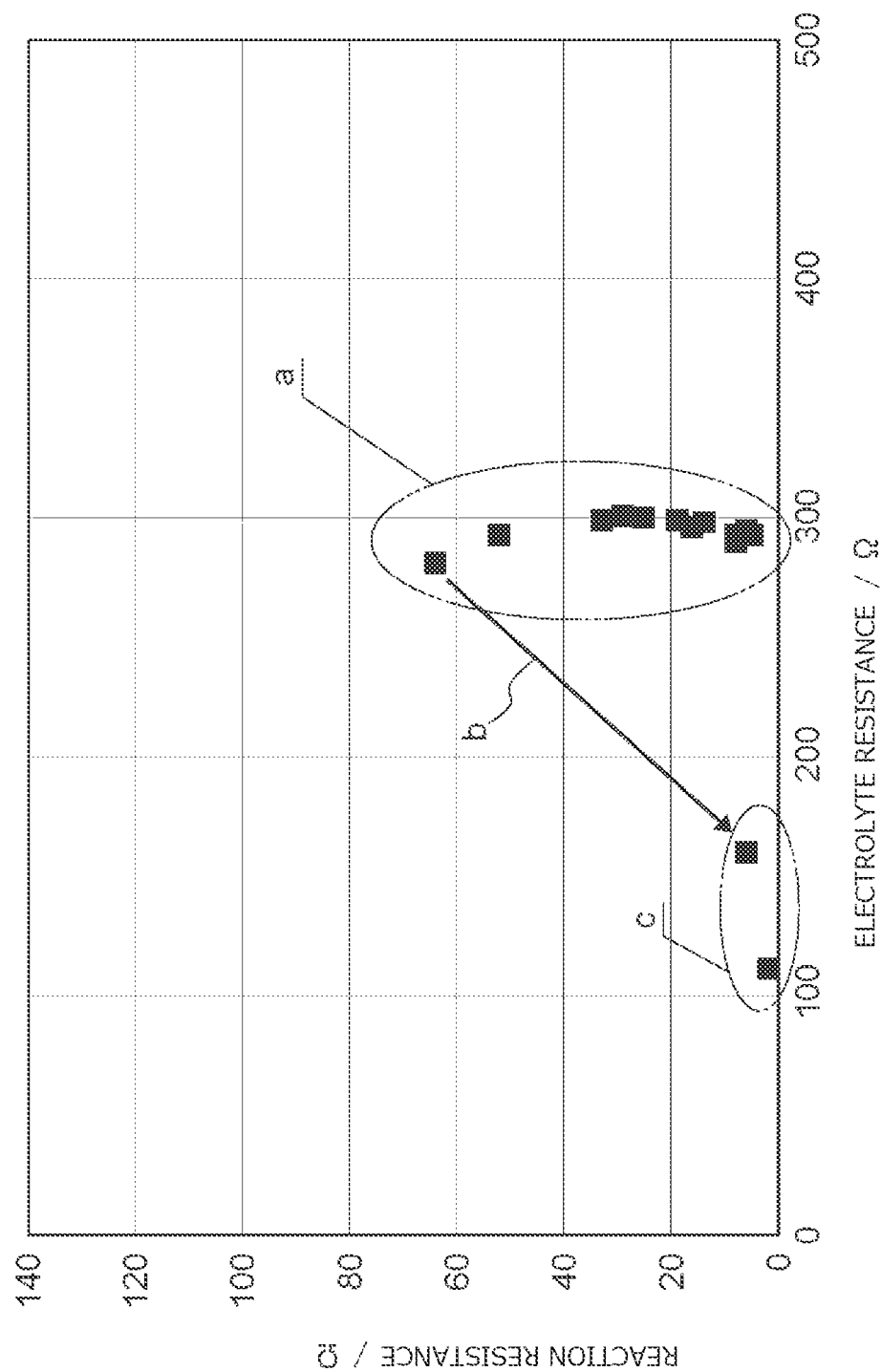
FIG. 5 is a graph illustrating the characteristics of electrolyte resistance and reaction resistance in the secondary battery according to the present embodiment.

FIG. 5 is a graph illustrating changes in the electrolyte resistance and the reaction resistance when the current density of the current flowing through the secondary battery 2 is increased during the charging of the secondary battery 2. In FIG. 5, the portion surrounded by "a" represents the changes in the electrolyte resistance and the reaction resistance when the current density is increased in a state before an internal short circuit occurs in the secondary battery 2. As illustrated in FIG. 5, there is a tendency that when the current density is increased in the secondary battery 2 before a short circuit occurs, the reaction resistance increases as the current density increases, while the electrolyte resistance does not substantially change.

Here, in the present embodiment, layers that contain a lithium alloy are used as the negative electrode active material layers constituting the negative electrode layers 104. According to the knowledge of the present inventors, it can be said that the tendency as illustrated in FIG. 5 is due to a phenomenon that is specific to a case in which a material containing a lithium alloy is used for the negative electrode active material layers, and for example, the following mechanism is conceivable. That is, in a state in which a current is flowing through the secondary battery 2 in the direction of charging the secondary battery 2, lithium ions are incorporated into the negative electrode active material layers from the positive electrode layers 102 via the electrolyte layers 103. Then, at least a part of the lithium ions incorporated in the negative electrode active material layers is taken into the lithium alloy contained in the negative electrode active material layers. During this action, the lithium alloy constituting the negative electrode active material layers appears to take in lithium ions thereby to cause progress of alloying or a change in the alloy composition. Then, such progress of alloying or a change in the alloy composition will be a cause of increasing the reaction resistance of the negative electrode active material layers. Therefore, when the charging current of the secondary battery 2 is relatively large, the reaction resistance of the negative electrode active material layers increases due to such progress of alloying or a change in the alloy composition, so that there is a strong tendency that the precipitation of lithium ions on the surfaces of the negative electrode active material layers, that is, the precipitation and growth of dendrites on the surfaces of the negative electrode active material layers, may be prioritized over the incorporation of lithium ions into the negative electrode active material layers. In particular, this tendency tends to become more prominent as the charging current increases, and therefore, in such cases, the growth of dendrites becomes more significant.

The phenomenon as above affects the change in the reaction resistance, but does not affect the change in the electrolyte resistance. That is, in an all-solid-state secondary battery that contains a lithium alloy for the negative electrode active material layers, sufficient contact is maintained between the electrolyte layers 103 and the negative electrode layers 104 at the interfaces before an internal short circuit due to dendrites occurs, and the electrolyte resistance is therefore constant. On the other hand, if the reaction resistance increases due to the phenomenon as above, growth of dendrites occurs while the electrolyte resistance is maintained in a state of being constant. In the present embodiment, such characteristics are utilized to predict the possibility of occurrence of an internal short circuit due to dendrites before the occurrence of an internal short circuit.

As illustrated in FIG. 5, when the current density is further increased in a state in which dendrites of lithium have grown, the dendrites grow further and penetrate the electrolyte layers 103 to cause a short circuit. As illustrated by an arrow "b" in FIG. 5, when a short circuit occurs, the reaction resistance decreases significantly to almost zero. In addition, as illustrated by a portion surrounded by "c" in FIG. 5, the state of low reaction resistance is maintained.

Additionally or alternatively, in the present embodiment, when the reaction resistance of the negative electrode active material layers increases due to the progress of alloying or the change in the alloy composition, the reaction resistance can be lowered by promoting the diffusion in the negative electrode active material layers. The reaction resistance can be lowered by the current control for the secondary battery 2 and/or the temperature control for the secondary battery 2. As the current control for the secondary current 2, the current of the secondary battery 2 may be lowered, or the current of the secondary battery 2 may be controlled to flow in a step-like manner. As the temperature control for the secondary battery 2, the battery temperature may be raised.

Figure 6:
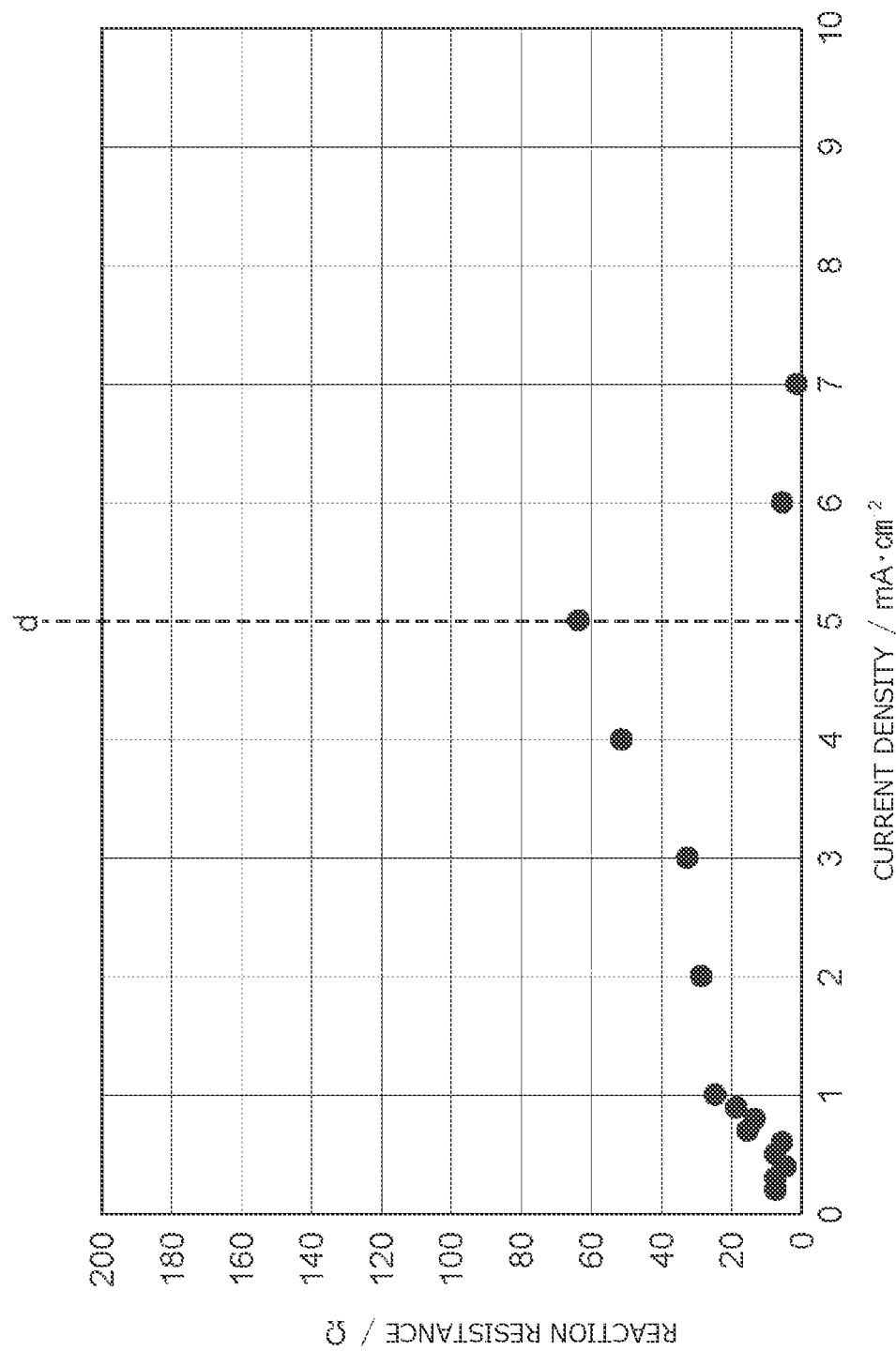
FIG. 6 is a graph illustrating the characteristics of changes in the reaction resistance with respect to the current density in the secondary battery according to the present embodiment.

FIG. 6 is a graph illustrating the characteristics of changes in the reaction resistance with respect to the current density in the secondary battery 2 according to the present embodiment. Dotted line "d" represents a current threshold for determining whether or not a short circuit occurs in a certain state of the secondary battery 2. In FIG. 6, the left side of the dotted line "d" represents a region in which a short circuit has not occurred, and the right side of the dotted line "d" represents a region in which a short circuit has occurred. As the current density of the current flowing through the secondary battery 2 is increased, the reaction resistance of the negative electrode active material layers increases due to the progress of alloying or the change in the alloy composition. As illustrated in FIG. 6, the reaction resistance increases until the current density gradually increases and reaches 5 mA·cm$^{-2}$. Then, when the current density becomes higher, an internal short circuit occurs and the reaction resistance becomes lower.

In the example illustrated in FIG. 6, the current is allowed to flow without causing a short circuit until the current density reaches 5 mA·cm$^{-2}$. When it is predicted that there is a possibility of occurrence of an internal short circuit, the controller 8 controls the current to reduce the reaction resistance of the negative electrode active material layers. Specifically, the controller 8 causes a step-like current to flow through the secondary battery 2. When a step-like current is caused to flow as described above, the diffusion of lithium is repeated in accordance with the period of a constant current included in the step-like shape; therefore, the current density can be increased while suppressing an increase of the reaction resistance. That is, the current threshold illustrated by the dotted line "d" of FIG. 6 shifts to the high density side. Through this operation, even when it is predicted that there is a possibility of occurrence of an internal short circuit, the current range in which the current is allowed to flow through the secondary battery 2 can be expanded.

Figure 7:
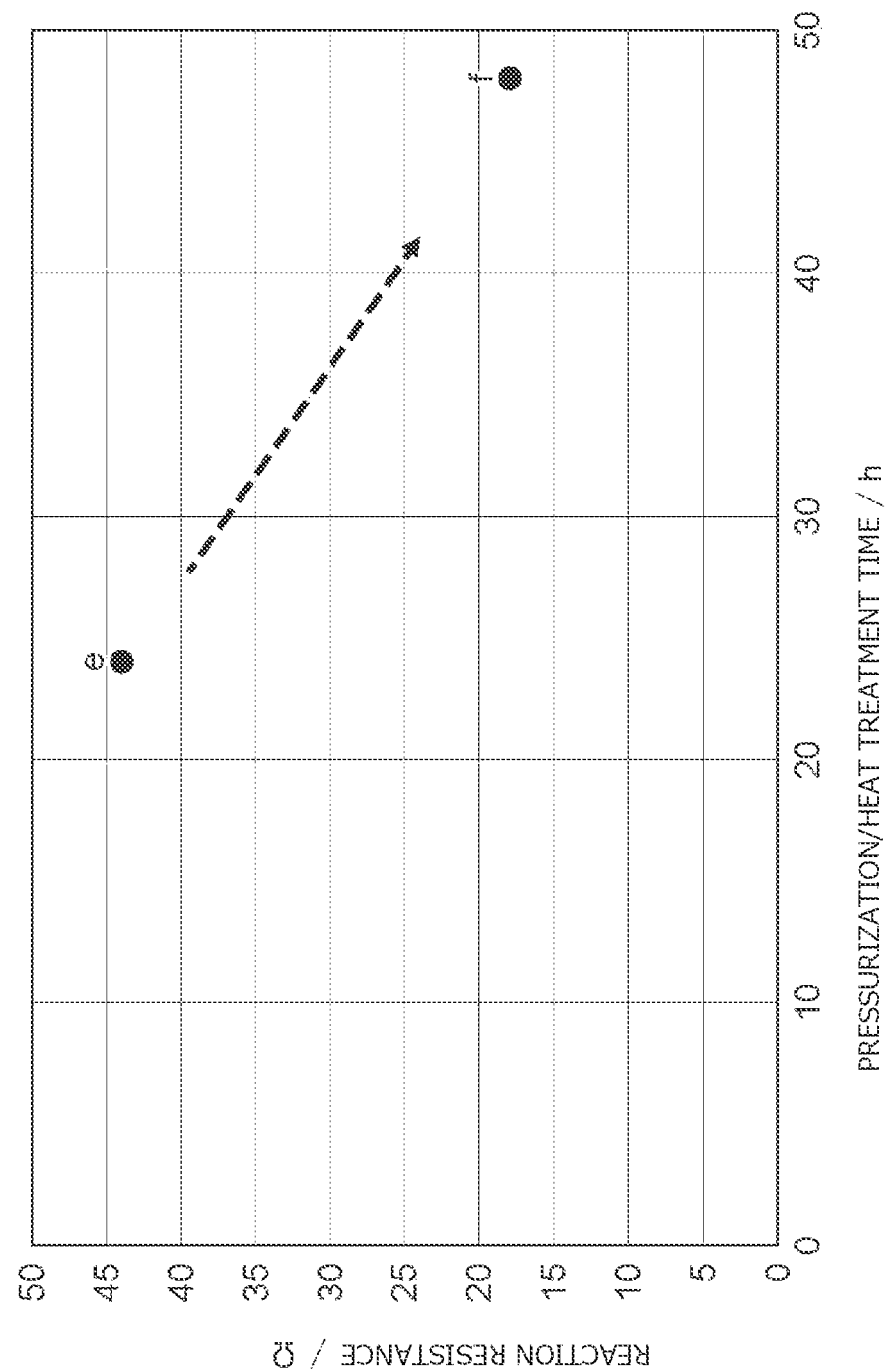
FIG. 7 is a graph illustrating the characteristics of changes in the reaction resistance with respect to the pressurization/heat treatment time in the secondary battery according to the present embodiment.

FIG. 7 is a graph illustrating the characteristics of changes in the reaction resistance with respect to the pressurization/heat treatment time in the secondary battery 2 according to the present embodiment. Point "e" indicates a state of the secondary battery 2 before raising the cell temperature, and point "f" indicates a state of the secondary battery 2 after raising the cell temperature. By raising the temperature of the secondary battery 2, the reaction resistance of the negative electrode active material layers is lowered. In the present embodiment, when the controller 8 predicts that there is a possibility of occurrence of an internal short circuit, a heater installed in the secondary battery 2 is operated to raise the temperature of the secondary battery 2. The controller 8 acquires a detected value from the temperature sensor 4 while the heater is operating, and manages the temperature of the secondary battery 2. The controller 8 operates the heater for a predetermined period such as 30 minutes, several hours, or several tens of hours to raise the temperature of the secondary battery 2. In the present embodiment, the method of raising the temperature of the secondary battery 2 may include repeating the charging and discharging of the secondary battery. In the present embodiment, the method of lowering the reaction resistance may include using both the current control and the temperature control with a heater or the like.

Figure 8:
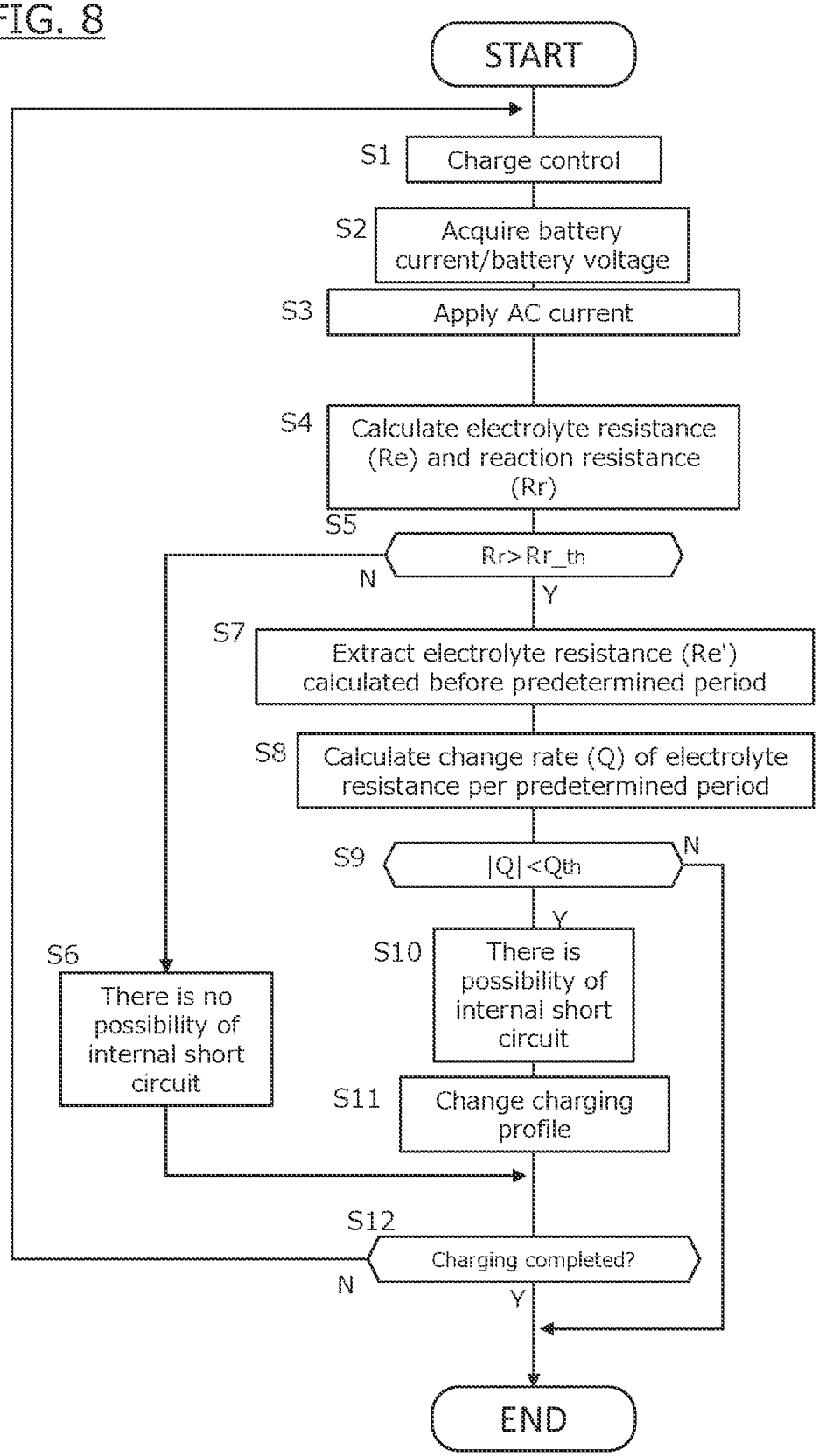
FIG. 8 is a flowchart of a charge control process executed in the charge control system according to the present embodiment.

The description will then be directed to a prediction control method for an internal short circuit of the secondary battery 2 and a charge control method for the secondary battery 2. FIG. 8 is a flowchart illustrating a procedure of the prediction process and a procedure of the charging process in the short-circuit prediction system.

When starting the charging, the controller 8 executes the control process illustrated in FIG. 8. In step S1, the controller 8 controls the voltage/current adjuster 5 so that the current flowing through the secondary battery 2 matches a predetermined profile, thereby to control the charging of the secondary battery 2. In step S2, the controller 8 acquires the detected voltage and detected current of the secondary battery 2 from the voltage sensor 3 and the current sensor 6. The controller 8 repeatedly executes the control process of steps S1 and S2 to perform the charging of the secondary battery 2.

In step S3, the controller 8 outputs a control signal to the impedance measurement instrument 7 and controls the impedance measurement instrument 7 to cause an AC current for measuring the AC impedance to flow through the secondary battery 2. In step S4, the impedance measurement instrument 7 measures the AC impedance of the secondary battery 2 by acquiring the response voltage corresponding to the AC current. In addition, the impedance measurement instrument 7 calculates the electrolyte resistance (Re) and reaction resistance (Rr) of the secondary battery 2 from the measured AC impedance. The controller 8 acquires the calculated electrolyte resistance and reaction resistance from the impedance measurement instrument 7 and stores the data of the acquired resistance values in the storage unit 82.

In step S5, the controller 8 compares the calculated reaction resistance (Rr) with a predetermined upper limit ($Rr_{th}$) and determines whether or not the calculated reaction resistance (Rr) is higher than the predetermined upper limit ($Rr_{th}$). When the calculated reaction resistance (Rr) is not higher than the predetermined upper limit ($Rr_{th}$), the controller 8 determines that there is no possibility of occurrence of an internal short circuit (step S6).

When the calculated reaction resistance (Rr) is higher than the predetermined upper limit ($Rr_{th}$), the controller 8 extracts, from the storage unit 82, an electrolyte resistance (Re') that has been calculated before a predetermined period (step S7). Data of the electrolyte resistance (Re') calculated in the impedance measurement instrument 7 at a predetermined calculation cycle is stored in the storage unit 82 with time. The controller 8 extracts, as the data of the electrolyte resistance (Re'), data before the predetermined period with respect to the calculation time point of the electrolyte resistance (Re) among the measurement data which has been stored with time.

In step S8, the controller 8 calculates a change rate (Q) of the electrolyte resistance per the predetermined period from the electrolyte resistance (Re) and the electrolyte resistance (Re'). The change rate may be calculated, for example, by dividing the difference between the electrolyte resistance (Re) and the electrolyte resistance (Re') by the electrolyte resistance (Re').

In step S9, the controller 8 determines whether or not the change rate (Q) of the electrolyte resistance is within a predetermined range. Specifically, the controller 8 calculates the absolute value of the change rate (Q) of the electrolyte resistance and determines whether or not the absolute value is less than a predetermined threshold ($Q_{th}$). When the absolute value of the change rate (Q) of the electrolyte resistance is less than the predetermined threshold ($Q_{th}$), the controller 8 predicts that there is a possibility of an internal short circuit due to dendrites (step S10). In step S11, the controller 8 changes the charging profile in order to continue the charging of the secondary battery 2 while preventing the growth of dendrites. Specifically, as described above with reference to FIG. 6, when increasing the charging current, the controller 8 raises the charging current in a step-like manner. This can suppress the increase in the reaction resistance, and the charging of the secondary battery 2 can therefore be continued while preventing the growth of dendrites. In the present embodiment, to prevent an increase in the reaction resistance of the negative electrode active material layers, the charging profile may be changed by suppressing the upper limit current value of the charging.

When the absolute value of the change rate (Q) of the electrolyte resistance is not less than the predetermined threshold ($Q_{th}$), the electrolyte resistance is high and there is a possibility that interfacial delamination occurs, for example, between the negative electrodes and the electrolyte; therefore, in the present embodiment, the charging of the secondary battery 2 is suspended and the control flow illustrated in FIG. 8 is concluded.

After the control process of step S6 or after the control process of step S11, the controller 8 calculates the SOC of the secondary battery 2 and determines whether or not the current SOC has reached a target SOC. When the current SOC has not reached the target SOC, the control flow of step S1 and subsequent steps is executed. When the current SOC has reached the target SOC, the control flow illustrated in FIG. 8 is concluded.

In the present embodiment, when it is predicted that there is a possibility of an internal short circuit, the charging of the secondary battery 2 may be concluded without executing the control flow of step S11.

The increase in the reaction resistance due to lithium dendrites is a phenomenon that appears in a state in which the current density is high to some extent. Therefore, the above-described prediction control for an internal short circuit (corresponding to the control process of steps S3 to S11 in FIG. 8) may be executed when the current density of the secondary battery 2 is higher than a predetermined current density threshold.

Figure 9:
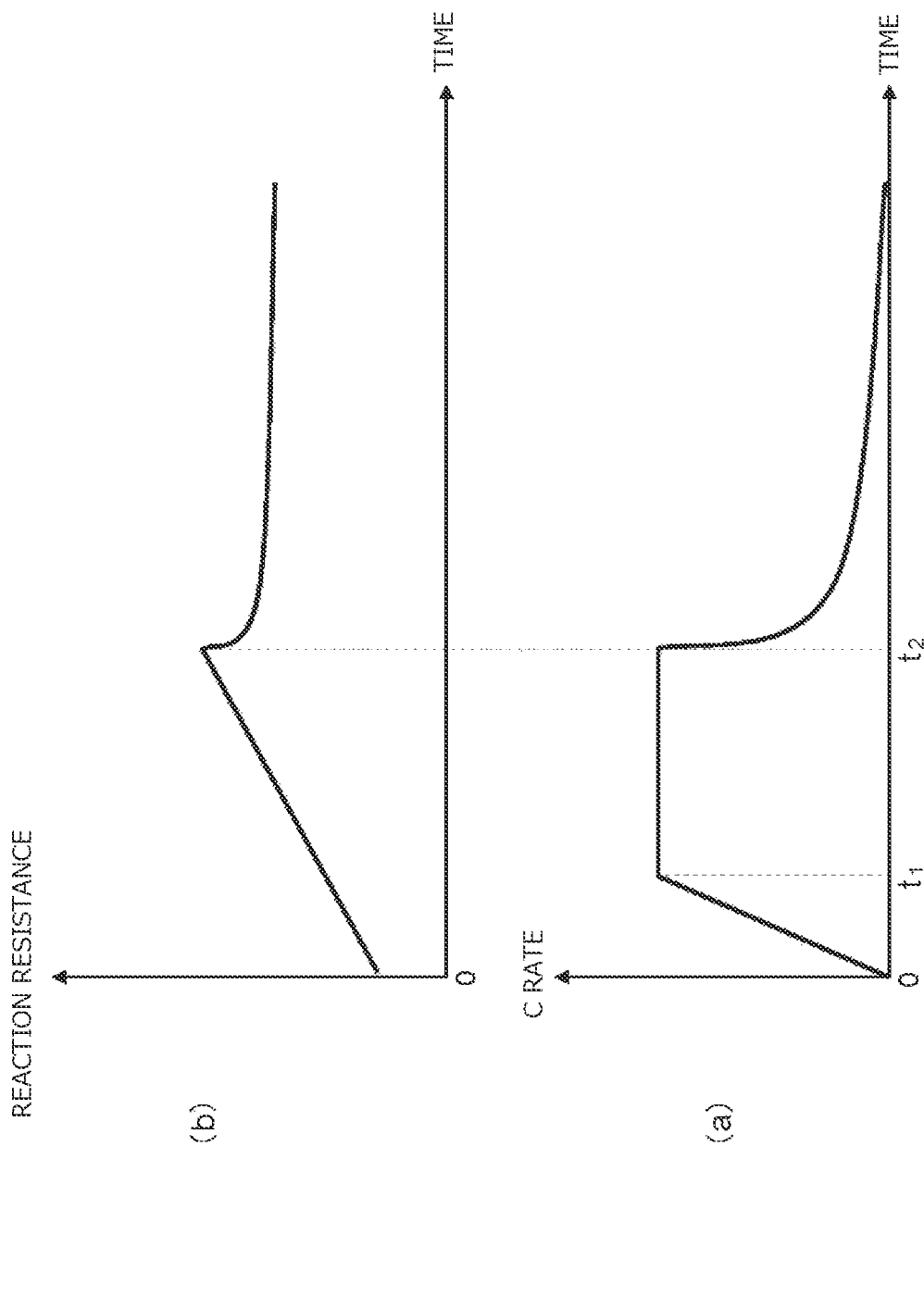
FIG. 9 is a graph illustrating changes in the charging current and the reaction resistance of the secondary battery according to the present embodiment when the secondary battery is charged with a predetermined charging profile.

The description will then be directed to the execution timing of the current control for lowering the reaction resistance and the charging profile in the charge control for the secondary battery. Here, FIG. 9 is a graph illustrating changes in the charging current and the reaction resistance of the secondary battery 2 according to the present embodiment when the secondary battery 2 is charged with a predetermined charging profile. As illustrated in (a) of FIG. 9, the secondary battery 2 is charged by changing the charging current so that the C rate increases in a proportional relationship with time until time t1. Then, at the time point of time $t_1$, the C rate becomes constant. The reaction resistance of the secondary battery 2 increases as the current increases. Then, at the time point of time $t_2$, the reaction resistance becomes higher than a predetermined upper limit, and the controller 8 lowers the current (start of low rate control). After time $t_2$, the reaction resistance decreases as the charging current decreases. In the example illustrated in FIG. 9, the current control for lowering the reaction resistance is executed, and the charging of the secondary battery 2 is concluded when the current decreases with time and the current value becomes zero.

Figure 10:
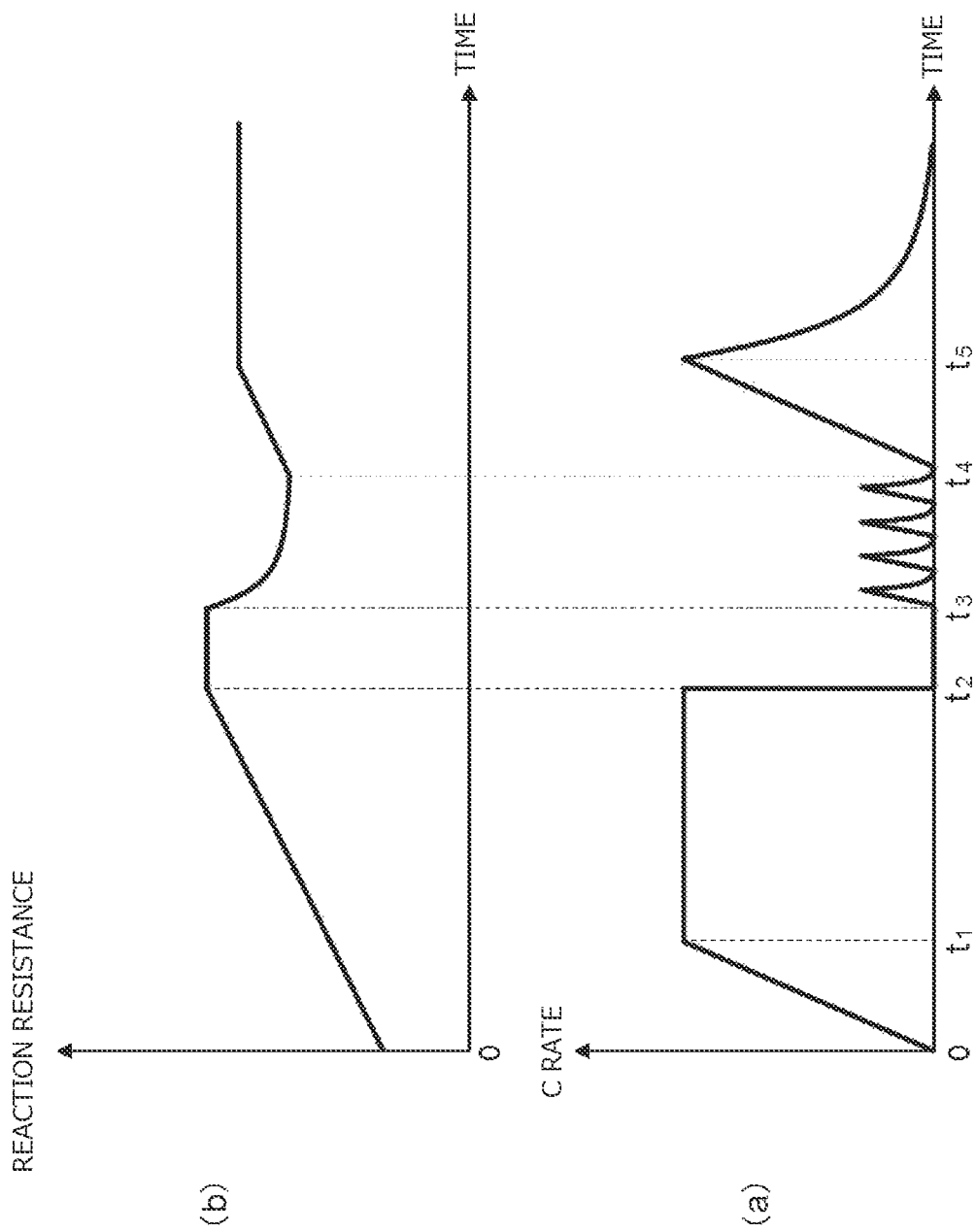
FIG. 10 is a graph illustrating changes in the charging current and the reaction resistance of the secondary battery according to the present embodiment when the secondary battery is charged with a predetermined charging profile.

FIG. 10 is a graph illustrating changes in the charging current and the reaction resistance of the secondary battery 2 according to the present embodiment when the secondary battery 2 is charged with a charging profile different from that of FIG. 9. The charging profile up to time $t_2$ is the same as the charging profile illustrated in FIG. 9. At the time point of time $t_2$, the reaction resistance becomes higher than a predetermined upper limit and the controller 8 temporarily sets the charging current to zero. From time $t_2$ to time $t_3$, the charging current remains at zero. From time $t_3$ to time $t_4$, the controller 8 repeats the charging and discharging of the secondary battery 2. As the current of the secondary battery 2 increases or decreases, the battery temperature rises and the reaction resistance decreases. The controller 8 charges the secondary battery 2 by changing the charging current so that the C rate increases in proportion to time from the time point of time $t_4$. The controller 8 lowers the charging current from the time point of time $t_5$. Then, when the SOC of the secondary battery 2 has reached the target SOC, charging of the secondary battery 2 is concluded.

As described above, in the present embodiment, the electrolyte resistance of the secondary battery 2 and the reaction resistance of the secondary battery 2 are calculated from the AC impedance, and when the change rate of the electrolyte resistance per a predetermined period is within a predetermined range and the reaction resistance becomes higher than a predetermined upper limit, the controller predicts that there is a possibility of occurrence of an internal short circuit. Through this operation, an internal short circuit due to lithium dendrites can be predicted before the occurrence of the short circuit from the change in the electrolyte resistance and the change in the reaction resistance. Moreover, an internal short circuit can be predicted before interfacial delamination occurs between the negative electrodes and the electrolyte.

In the present embodiment, when it is predicted that there is a possibility of occurrence of an internal short circuit, the current of the secondary battery 2 is controlled to lower the reaction resistance. Through this operation, the occurrence and growth of dendrites can be suppressed by controlling the reaction resistance.

In the present embodiment, when it is predicted that there is a possibility of occurrence of an internal short circuit, the temperature of the secondary battery 2 is raised to lower the reaction resistance. Through this operation, the occurrence and growth of dendrites can be suppressed by controlling the reaction resistance.

In the present embodiment, when it is predicted that there is a possibility of occurrence of an internal short circuit, the charging and discharging of the secondary battery 2 is repeated to lower the reaction resistance. Through this operation, the occurrence and growth of dendrites can be suppressed by controlling the reaction resistance.

In the present embodiment, in a state in which the current density of the current flowing through the secondary battery is higher than a predetermined current density threshold, when the change rate of the electrolyte resistance is not higher than a predetermined value and the reaction resistance becomes higher than an upper limit, it is predicted that there is a possibility of occurrence of an internal short circuit. Through this operation, an internal short circuit due to lithium dendrites can be predicted before the occurrence of the short circuit from the change in the reaction resistance. Moreover, an internal short circuit can be predicted before interfacial delamination occurs between the negative electrodes and the electrolyte.

In the present embodiment, each negative electrode has a lithium metal layer that contains lithium metal and an intermediate layer that contains a metal different from the lithium metal, the intermediate layer is a layer between the lithium metal layer and the solid electrolyte, and at least a part of the lithium metal and at least a part of the metal forming the intermediate layer are alloyed. Through this configuration, the intermediate layer to be alloyed is introduced thereby to make the contact area uniform, and the interfacial delamination can be suppressed.

In the above-described embodiment, it suffices that the short-circuit prediction device includes at least the impedance measurement instrument 7 and the controller 8.

Embodiments heretofore explained are described to facilitate understanding of the present invention and are not described to limit the present invention. It is therefore intended that the elements disclosed in the above embodiments include all design changes and equivalents to fall within the technical scope of the present invention.

EXAMPLES

The present invention will be described below with reference to more detailed examples, but the present invention is not limited to these examples.

<Preparation of Prototypes (Examples)>

An unsintered LPS pellet was prepared by pressure-molding 100 mg of LPS powder at 390 MPa for 1 minute. Then, the obtained LPS pellet was sintered and polished into a laminar form. Gold was vapor-deposited on both surfaces of the polished LPS pellet in a vacuum state. The thickness of the gold layers was 30 nm. Then, in a vacuum state, lithium metal was vapor-deposited on both surfaces of the LPS pellet on which gold was vapor-deposited. The thickness of the lithium layers was 3 μm. Then, plate-like metal tabs were adhered to a cell (Li|Au|LPS|Au|Li) manufactured through these steps to prepare a lithium symmetric cell as each prototype. In the obtained lithium symmetric cell, alloy layers of gold and lithium (lithium-gold alloy layers) were formed between the gold layers and the adjacent lithium layers.

<Preparation of Prototypes (Comparative Examples)>

The prototypes of Comparative Examples are the same as the prototypes of Examples except that gold layers are not provided between the lithium negative electrodes and the electrolyte layers (LPSs). Prototypes (Comparative Examples) were prepared by the same method as that for the above-described Prototypes (Examples) except that the step of vapor-depositing gold on both surfaces of the polished LPS pellet was omitted from the process for the prototypes of Examples.

<Electrochemical Measurement>

Figure 11:
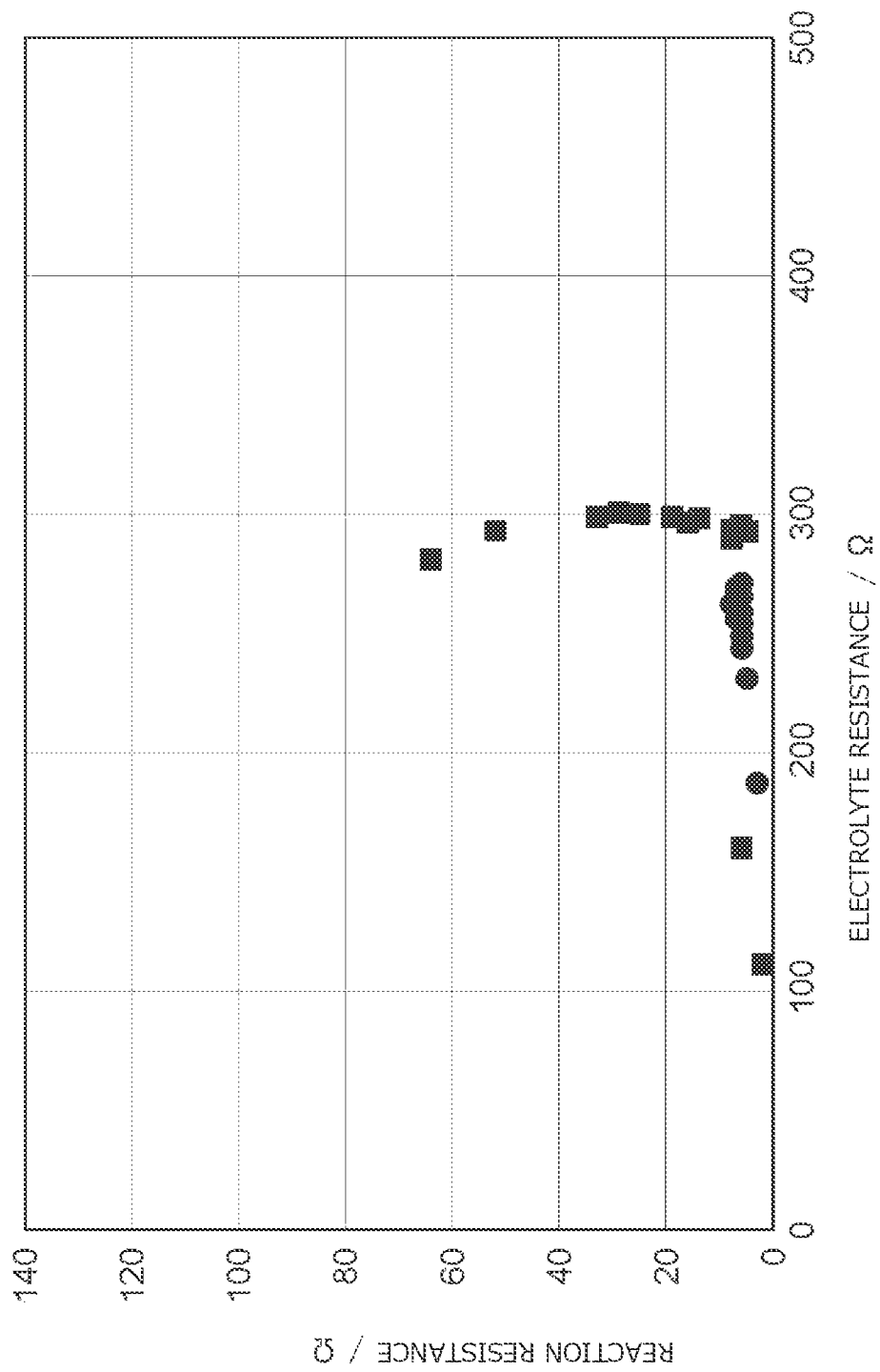
FIG. 11 is a diagram for describing the evaluation results of Examples and Comparative Examples, or a graph illustrating the characteristics of the electrolyte resistance and reaction resistance.

For each of the prototypes of Examples and Comparative Examples obtained above, charge/discharge measurement and EIS measurement were performed in an atmosphere of 60° C. while applying a pressure of 1.5 MPa. The electrolyte resistance and reaction resistance of the prototypes of Examples and Comparative Examples were obtained for each increasing current from the measurement results of the EIS measurement while gradually increasing the current value. FIG. 11 is a graph illustrating the measurement results, in which the plotted square points indicate Examples and the circles indicate Comparative Examples.

<Evaluation of Examples and Comparative Examples>

As illustrated in FIG. 11, in Examples (square plots in the graph), it can be confirmed that the change in the electrolyte resistance is small and only the negative electrode reaction resistance increases continuously as the current increases. On the other hand, in Comparative Examples (circle plots in the graph), it can be confirmed that both the negative electrode reaction resistance and the electrolyte resistance increase continuously as the current increases. In other words, it can be confirmed that in Examples, the interfacial delamination does not occur between the negative electrodes and the electrolyte until an internal short circuit occurs, whereas in Comparative Examples, the interfacial delamination occurs.

DESCRIPTION OF REFERENCE NUMERALS

1 Short-circuit prediction system
2 Secondary battery
3 Voltage sensor
4 Temperature sensor
5 Voltage/current adjuster
6 Current sensor
7 Impedance measurement instrument
8 Controller
9 External power source

The invention claimed is:

1. A short-circuit prediction device for predicting presence or absence of occurrence of an internal short circuit in a secondary battery, the secondary battery having a positive electrode, a solid electrolyte, and a negative electrode that contains a lithium alloy, the short-circuit prediction device comprising:
a measurement instrument that measures AC impedance of the secondary battery; and
a controller that predicts the internal short circuit in the secondary battery, wherein
the measurement instrument calculates electrolyte resistance of the secondary battery and reaction resistance of the secondary battery from the AC impedance, and
when a change rate of the electrolyte resistance per a predetermined period is within a predetermined range and the reaction resistance becomes higher than a predetermined upper limit, the controller predicts that there is a possibility of occurrence of the internal short circuit.

2. The short-circuit prediction device according to claim 1, wherein when predicting that there is a possibility of occurrence of the internal short circuit, the controller controls a current of the secondary battery to lower the reaction resistance.

3. The short-circuit prediction device according to claim 1, wherein when predicting that there is a possibility of occurrence of the internal short circuit, the controller raises a temperature of the secondary battery to lower the reaction resistance.

4. The short-circuit prediction device according to claim 3, wherein when predicting that there is a possibility of occurrence of the internal short circuit, the controller repeats charging and discharging of the secondary battery to lower the reaction resistance.

5. The short-circuit prediction device according to claim 1, wherein in a state in which a current density of a current flowing through the secondary battery is higher than a predetermined current density threshold, when the change rate of the electrolyte resistance per the predetermined period is within the predetermined range and the reaction resistance becomes higher than the predetermined upper limit, the controller predicts that there is a possibility of occurrence of the internal short circuit.

6. A short-circuit prediction method for predicting presence or absence of occurrence of an internal short circuit in a secondary battery, the secondary battery having a positive electrode, a solid electrolyte, and a negative electrode that contains a lithium alloy, the short-circuit prediction method comprising:
- measuring AC impedance of the secondary battery;
- calculating electrolyte resistance of the secondary battery and reaction resistance of the secondary battery from the AC impedance, and
- when a change rate of the electrolyte resistance per a predetermined period is within a predetermined range and the reaction resistance becomes higher than a predetermined upper limit, predicting that there is a possibility of occurrence of the internal short circuit.

7. A short-circuit prediction system comprising:
- a secondary battery having a positive electrode, a solid electrolyte, and a negative electrode that contains a lithium alloy;
- a measurement instrument that is connected to the secondary battery and measures AC impedance of the secondary battery; and
- a controller that predicts an internal short circuit in the secondary battery, wherein
- the measurement instrument calculates electrolyte resistance of the secondary battery and reaction resistance of the secondary battery from the AC impedance, and
- when a change rate of the electrolyte resistance per a predetermined period is within a predetermined range and the reaction resistance becomes higher than a predetermined upper limit, the controller predicts that there is a possibility of occurrence of the internal short circuit.

8. The short-circuit prediction system according to claim 7, wherein
- the negative electrode has a lithium metal layer that contains lithium metal and an intermediate layer that contains a metal different from the lithium metal,
- the intermediate layer is a layer between the lithium metal layer and the solid electrolyte, and
- at least a part of the lithium metal and at least a part of the metal forming the intermediate layer are alloyed.

* * * * *